United States Patent
Mui et al.

(10) Patent No.: US 10,446,416 B2
(45) Date of Patent: Oct. 15, 2019

(54) METHOD AND APPARATUS FOR PROCESSING WAFER-SHAPED ARTICLES

(71) Applicant: LAM RESEARCH AG, Villach (AT)

(72) Inventors: David Mui, Fremont, CA (US); Nathan Musselwhite, Oakland, CA (US); Michael Ravkin, Los Altos, CA (US)

(73) Assignee: LAM RESEARCH AG, Villach (AT)

( * ) Notice: Subject to any disclaimer, the term of this patent is extended or adjusted under 35 U.S.C. 154(b) by 326 days.

(21) Appl. No.: 15/232,594

(22) Filed: Aug. 9, 2016

(65) Prior Publication Data

US 2018/0047593 A1    Feb. 15, 2018

(51) Int. Cl.
*H01L 21/67* (2006.01)
*H01L 21/68* (2006.01)
*H01L 21/687* (2006.01)

(52) U.S. Cl.
CPC .. *H01L 21/67034* (2013.01); *H01L 21/67051* (2013.01); *H01L 21/67115* (2013.01); *H01L 21/68* (2013.01); *H01L 21/68721* (2013.01); *H01L 21/68728* (2013.01); *H01L 21/68735* (2013.01); *H01L 21/68792* (2013.01)

(58) Field of Classification Search
CPC ................................................. H01L 21/67063
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,485,531 B1 | 11/2002 | Schob | |
| 9,245,777 B2 | 1/2016 | Plazonic et al. | |
| 2012/0103371 A1* | 5/2012 | Yun | H01L 21/67034 134/26 |

FOREIGN PATENT DOCUMENTS

WO    2007/101764 A1    9/2007

* cited by examiner

*Primary Examiner* — Seahvosh Nikmanesh

(57) ABSTRACT

A method for drying wafer-shaped articles comprises rotating a wafer-shaped article of a predetermined diameter on a rotary chuck, and dispensing a drying liquid onto one side of the wafer-shaped article. The drying liquid comprises greater than 50 mass % of an organic solvent. During at least part of the dispensing step, the wafer-shaped article is heated with a heating assembly. During at least part of the dispensing step a fluorine-containing compound is present in the drying liquid or in a gas that surrounds the drying liquid as the drying liquid contacts the wafer-shaped article.

19 Claims, 3 Drawing Sheets

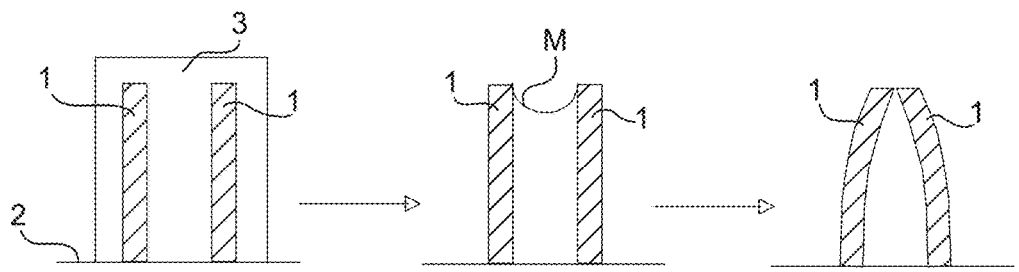
*Fig. 1a*
PRIOR ART
*Fig. 1b*
PRIOR ART
*Fig. 1c*
PRIOR ART
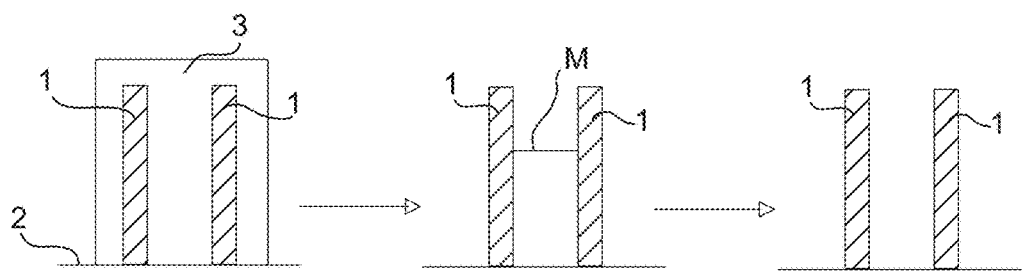
*Fig. 2a*
*Fig. 2b*
*Fig. 2c*

METHOD AND APPARATUS FOR PROCESSING WAFER-SHAPED ARTICLES

BACKGROUND OF THE INVENTION

1. Field of the Invention

The invention relates generally to a method and apparatus for processing wafer-shaped articles, such as semiconductor wafers.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

As the device features formed on such wafers continues to decrease in their layout dimensions, with an attendant increase in the aspect ratio of those device features, and as the diameter of such wafers continues to increase, the phenomenon of pattern collapse during drying of the wafers becomes increasingly problematic. Existing techniques for preventing pattern collapse are of limited effectiveness.

SUMMARY OF THE INVENTION

In one aspect, the present invention relates to a method for drying wafer-shaped articles, comprising rotating a wafer-shaped article of a predetermined diameter on a rotary chuck, and dispensing a drying liquid onto one side of the wafer-shaped article. The drying liquid comprises greater than 50 mass % of an organic solvent. During at least part of the dispensing step, the wafer-shaped article is heated with a heating assembly. During at least part of the dispensing step a fluorine-containing compound is present in the drying liquid or in a gas that surrounds the drying liquid as the drying liquid contacts the wafer-shaped article.

In preferred embodiments of the method according to the foregoing aspect of the present invention, the organic solvent is an alcohol.

In preferred embodiments of the method according to the foregoing aspect of the present invention, the organic solvent is isopropyl alcohol.

In preferred embodiments of the method according to the foregoing aspect of the present invention, during at least part of the dispensing step, the fluorine-containing compound is contained in the drying liquid.

In preferred embodiments of the method according to the foregoing aspect of the present invention, the fluorine-containing compound is hydrofluoric acid.

In preferred embodiments of the method according to the foregoing aspect of the present invention, the fluorine-containing compound is present in the drying liquid at a concentration of at least 0.0001 mass % and less than 10 mass %.

In preferred embodiments of the method according to the foregoing aspect of the present invention, the fluorine-containing compound is present in the drying liquid at a concentration of at least 0.05 mass % and less than 10 mass %.

In preferred embodiments of the method according to the foregoing aspect of the present invention, during at least part of the dispensing step, the fluorine-containing compound is present in a gas surrounding the drying liquid while contacting the wafer-shaped article.

In preferred embodiments of the method according to the foregoing aspect of the present invention, the fluorine-containing gas is hydrogen fluoride.

In preferred embodiments of the method according to the foregoing aspect of the present invention, the fluorine-containing gas has an oxygen concentration of less than 1 mass %.

In preferred embodiments of the method according to the foregoing aspect of the present invention, the wafer-shaped article comprises semiconductor device structures formed on the one side of the wafer-shaped article.

In preferred embodiments of the method according to the foregoing aspect of the present invention, the heating step comprises heating the wafer-shaped article to a temperature in a range of 30-300° C., and more preferably 30-82° C.

In preferred embodiments of the method according to the foregoing aspect of the present invention, the heating step comprises heating the wafer-shaped article to a temperature in a range of 40-300° C., and more preferably 40-82° C.

In preferred embodiments of the method according to the foregoing aspect of the present invention, the drying liquid comprises less than 30 mass % water.

In preferred embodiments of the method according to the foregoing aspect of the present invention, the drying liquid comprises less than 15 mass % water.

In preferred embodiments of the method according to the foregoing aspect of the present invention, the heating assembly comprises an array of radiant heating elements, the array covering the wafer-shaped article.

In preferred embodiments of the method according to the foregoing aspect of the present invention, the array of radiant heating elements is distributed among at least five individually controllable groups each occupying a respectively different zone extending from a more central region of the rotary chuck to a more peripheral region of the rotary chuck.

In preferred embodiments of the method according to the foregoing aspect of the present invention, the dispensing step is performed using a liquid dispenser comprising one or more dispensing orifices configured to move a discharge point from a more central region of the wafer-shaped article to a more peripheral region of the wafer-shaped article, and wherein a power supplied to each of the at least five individually controllable groups of radiant heating elements is based on a position of the discharge point of the liquid dispenser.

In preferred embodiments of the method according to the foregoing aspect of the present invention, prior to or during the dispensing step, the drying liquid is mixed with the fluorine-containing compound in a manifold.

In another aspect, the present invention relates to a method for drying wafer-shaped articles, comprising rotating a wafer-shaped article of a predetermined diameter on a rotary chuck, and dispensing a drying liquid onto one side of the wafer-shaped article. The drying liquid comprises greater than 50 mass % of isopropyl alcohol and 0.05-10 mass % hydrofluoric acid. During at least part of the dispensing step, the wafer-shaped article is heated to a temperature in a range of 40-82° C. with a heating assembly that is substantially coextensive with the wafer-shaped article.

BRIEF DESCRIPTION OF THE DRAWINGS

Other objects, features and advantages of the invention will become more apparent after reading the following detailed description of preferred embodiments of the invention, given with reference to the accompanying drawings, in which:

FIGS. 1a, 1b and 1c are an explanatory illustration of the phenomenon of pattern collapse;

FIGS. 2a, 2b and 2c are an explanatory illustration of the desired avoidance of pattern collapse;

DETAILED DESCRIPTION OF PREFERRED EMBODIMENTS

Referring now to FIG. 1, device features 1 formed on a semiconductor wafer 2 may be fins of doped silicon or any other structures or materials formed or used in the fabrication of semiconductor devices. During processing, the wafer 2 is rinsed, typically first with water and then with isopropyl alcohol (IPA), which is shown at 3 in FIG. 1a surrounding the fins 1. As the wafer is dried, the IPA 3 evaporates; however, owing to surface tension and the high aspect ratio of the fins 1, the IPA 3 is driven off more slowly from the space between the fins, which results in the formation of a meniscus shown at M in FIG. 1b. As drying of the wafer continues, the surface tension of the IPA 3 pulls the fins 1 toward each other as shown in FIG. 1c, which can impair or prevent the correct performance of the associated semiconductor device. The conventional drying liquids can also leave a residue that results in defects in the performance of the devices.

Conventional techniques for mitigating the phenomenon of pattern collapse include the use of a rinse liquid having lower surface tension than deionized water, with IPA being the predominant choice, and the use of such rinse liquid at elevated temperature; however, as noted above, such techniques have limited effect on reducing pattern collapse, or avoiding damaging residues.

The present inventors have discovered that the use of a drying liquid as described in the above summary, in conjunction with heating of the wafer-shaped article, achieves drying as illustrated in FIGS. 2a, 2b and 2c, in which pattern collapse is avoided and moreover no residue remains.

Figure 3:
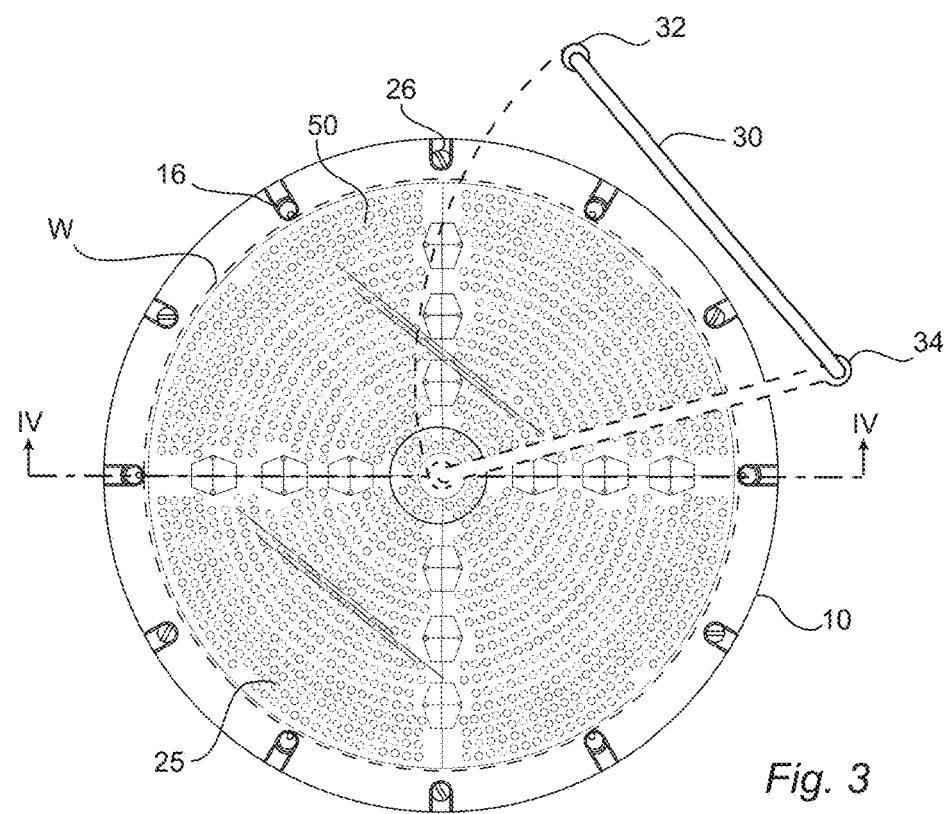
FIG. 3 is a plan view of an apparatus suitable for use in a first embodiment of the present invention.

FIG. 3 shows an example of an apparatus designed to implement the present method, in which a spin chuck 10 is designed to hold and rotate a wafer W of a predetermined diameter, for example 300 mm or 450 mm. Wafer W is held by a circular series of gripping pins 16, which in this embodiment are six in number. Pins 16 pass through openings in a transparent plate 25 made of quartz or sapphire. Plate 25 is secured to chuck 10 by screws 26 and rotates with the chuck 10. When a wafer W is positioned on the chuck, it is held above the plate 25 so that the lower surface of the wafer is parallel to the plate 25 and spaced therefrom by a small gap.

Beneath the transparent plate 25 is mounted a radiant heating assembly 50, which will be described in greater detail below.

Adjacent the chuck 10 a boom swing arm 30 is mounted for pivotal motion about its drive motor 34. Arm 30 is supplied with drying liquid, which is discharged downwardly through its discharge nozzle 32. Boom swing arm 30 is movable between a standby position shown in solid line in FIG. 2, and a central position shown in broken line. Discharge nozzle 32 can therefore scan across the full radius of a wafer W, and when a wafer W is rotated by chuck 10, thereby dispense liquid onto its entire upwardly-facing surface.

Alternatively, discharge nozzle can be positioned stationarily above the center of the wafer W, i.e., on the axis of rotation of the rotary chuck, and the dispensed drying liquid can be caused to flow across the entire upwardly-facing surface of wafer W by centrifugal force, as the chuck and wafer rotate.

Figure 4:
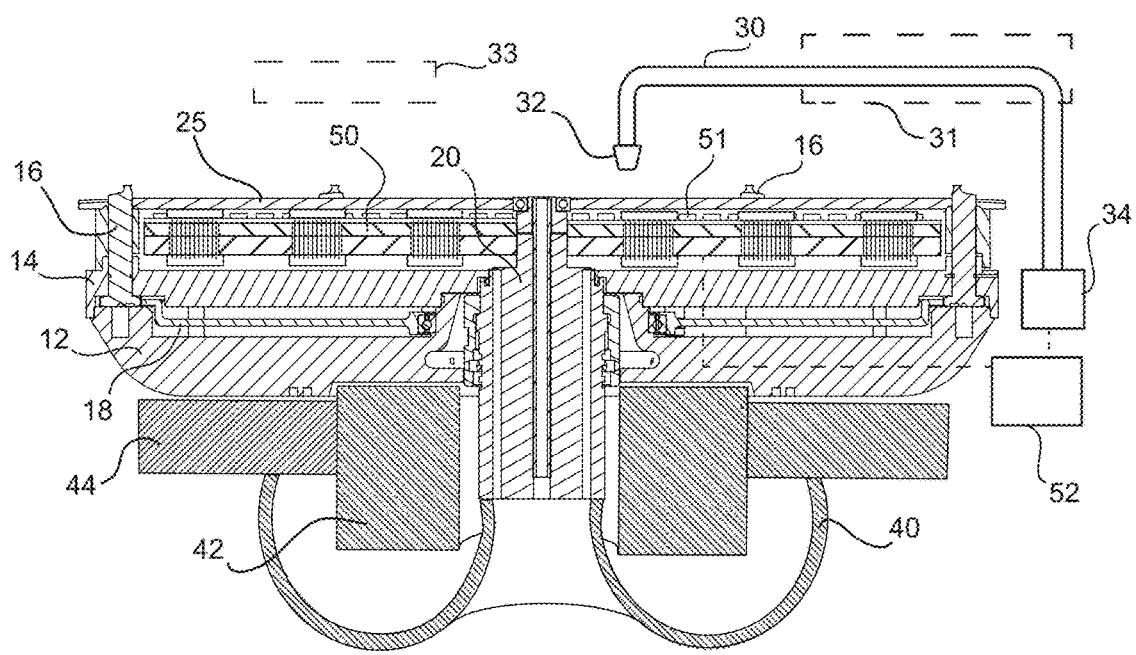
FIG. 4 is a sectional view along the line IV-IV in FIG. 3.

Turning now to FIG. 4, it can be seen that the rotary chuck 10 is made up of a lower chuck body 12 and an upper chuck body 14, which are secured to one another and are journalled for rotation about a stationary central post 20. The pins 16 and transparent plate 25 also rotate with the chuck 10 in this embodiment, as does the ring gear 18 which is in continuous meshing engagement with each of the gripping pins 16 via gear teeth provided at the bases of these latter. Ring gear 18 can also rotate relative to the chuck 10 to a limit extent, thereby to rotate pins 16 about their respective axes and move the uppermost eccentric gripping portions between their open and closed positions, in a manner well known per se.

The stationary post 20 is mounted on a machine frame 40 of the apparatus, as is a stator 44, whereas rotor 42 is secured to the lower chuck body 12, with the stator 44 and rotor 42 constituting a magnetic motor that drives the chuck 10 in rotation. Further particulars of the overall chuck structure are described for example in commonly-owned U.S. Pat. No. 9,245,777.

Radiant heating assembly 50 in this embodiment is mounted on the stationary post 20, and therefore does not rotate, whereas it is enveloped by the rotating structure of the chuck comprising elements 25, 14, 16. Radiant heating assembly 50 in this embodiment comprises a multiplicity of blue LEDs 51 mounted facing the transparent plate 25, and an on-board controller 52 mounted on the underside of heating assembly 50. Controller 52 controls the turning on and off, as well as the power, of the blue LEDs 51, and also communicates wirelessly with the motor 34 of the boom swing arm 30.

Figure 5:
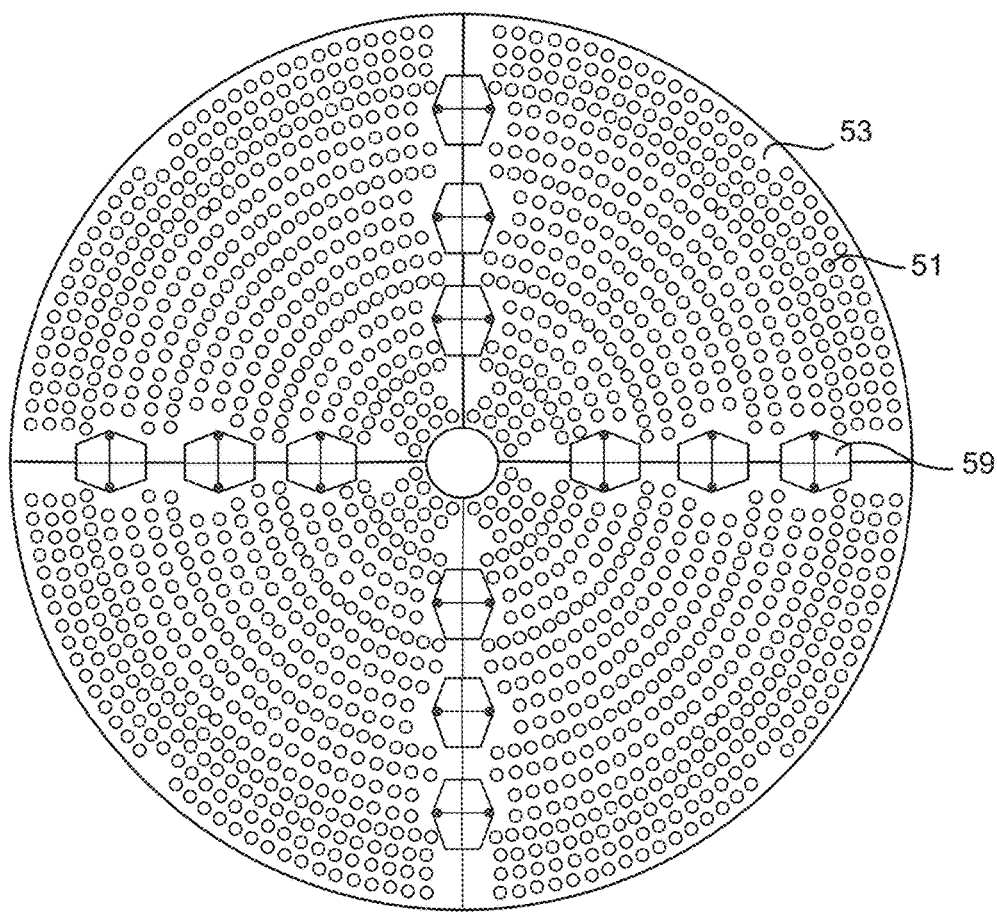
FIG. 5 is a plan view of the heating assembly of the apparatus of FIGS. 3 and 4.

As shown in FIG. 5, the PCB 53 of this embodiment is formed in four quadrants, which are joined together by connectors 59. The LED elements 51 are formed in groups of sixteen, and the LEDs may be powered individually in groups as small as sixteen.

It will be seen in FIG. 5 that the LEDs 51 are arranged in twenty concentric circles, and that the number of LEDs in each circle is a multiple of sixteen. Thus, each concentric circle can be individually controlled as a separate heating zone, by virtue of the arrangement described above.

The blue LED lamps 51 have a maximum intensity at a wavelength of about 450 nm. Other sources of radiation could be used, but it is preferred to use sources emitting radiation having a maximum intensity in a wavelength range from 390 nm to 550 nm and more preferably in a wavelength range from 400 nm to 500 nm.

Whereas radiation of that wavelength characteristic is largely transmitted by the plate 25, that same radiation is largely absorbed by the semiconductor material of the wafer W, especially when the wafer W is silicon.

This arrangement allows very fast local heating of the wafer W, in a manner that causes evaporation of drying liquid before the damaging meniscus has a chance to form. For example, each LED 51 may have a power consumption of 10 W and provides a light power of 3 W, which light power can be generated nearly instantaneously. Additionally, lesser light powers can be generated for selected LEDs 51 when desired, for examples by pulsing the power supply to selected LEDs 51 at for example 500 Hz, in a manner known per se.

Figure 6A:
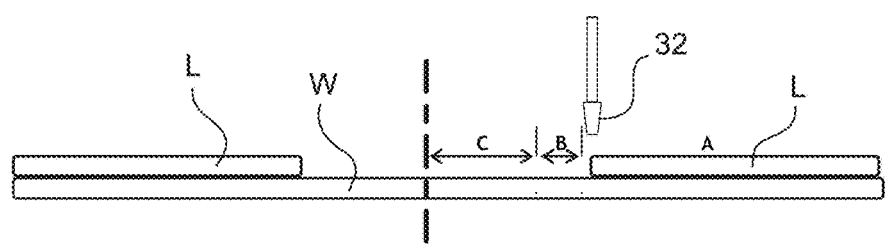
FIGS. 6a and 6b show preferred processing conditions for use of the apparatus of FIGS. 3-5.
Figure 6B:
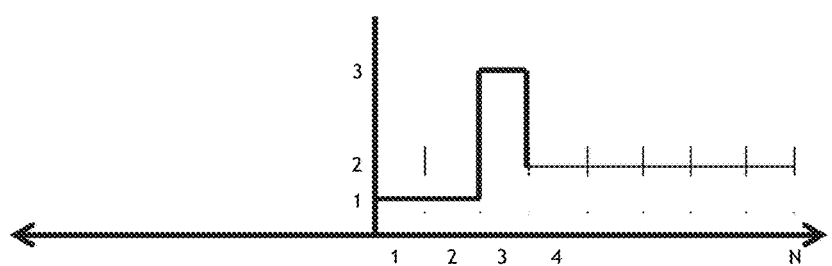

FIGS. 6a and 6b show a preferred example of operation of the apparatus of this embodiment. The wafer W can be considered to be divided into N zones 1, 2, 3, 4, . . . N, corresponding to the number of individually controllable concentric zones of the heating assembly 50, such that the abscissa in FIG. 6b represent the number of zones as well as the radial distance from the center to the edge of the wafer.

First a wafer W is loaded onto the chuck, and the chuck is caused to rotate. Then, a drying liquid is dispensed onto the upper side of the wafer W through nozzle 32. The wafer may be preheated either by use of the heating assembly 50 or by pre-heating the drying liquid, or both.

The drying liquid comprises greater than 50 mass % of an organic solvent, preferably isopropyl alcohol. The drying is also effected by the use of a fluorine-containing compound, which is preferably hydrofluoric acid. The fluorine containing compound may be mixed with the organic solvent in the manifold 31 of the dispenser 30. Alternatively, a gas containing the fluorine compound in the form of hydrogen fluoride may be dispensed from a gas dispenser shown schematically at 33 in FIG. 4, so as to surround the drying liquid as it contacts the upper surface of the wafer W.

In the region A shown in FIG. 6a, liquid L remains on the surface of wafer W, and the objective is to heat that liquid L, which in this example is a mixture of isopropyl alcohol (IPA) and hydrofluoric acid (HF) to a temperature that is elevated but which does not cause premature drying of the wafer W. That temperature corresponds to the heat flux of the heater in zones 4 through N being maintained at level 2, as shown on the ordinate in FIG. 6b.

On the other hand, in the region B, corresponding to zone 3 of the radiant heating assembly 50, the temperature of the wafer W is elevated substantially so as to cause the evaporation rate of the drying liquid to be sufficiently high that there is no meniscus (i.e., a flat or 90° meniscus) between closely adjacent device features, so as to avoid pattern collapse as described above. Within region C, corresponding to heater zones 1 and 2, the already dried wafer is maintained at a lower but still elevated temperature, to ensure complete evaporation of rinse liquid and to prevent condensation on the dried wafer surface.

It will be appreciated that the control of the power supplied to the various concentric zones of the heating assembly corresponds to the radial position of the discharge nozzle 32 of the rinse fluid, and thus controller 52 controls the power supply to the LEDs 51 of the relevant zones based on the radial position of the discharge nozzle.

Drying without pattern collapse or residue is facilitated in the present method by the use of the fluorine-containing compound in the drying liquid that is greater than 50 mass % organic solvent, such that the drying liquid preferably has a concentration of the fluorine-containing compound that is at least 0.0001 mass % and less than 10 mass %, more preferably at least 0.05 mass % and less than 10 mass %. If a fluorine-containing gas is used, it is preferred that its oxygen concentration be less than 1 mass %. The drying liquid should moreover comprise less than 30 mass % water in preferred embodiments of the present method, and more preferably less than 15 mass % water.

The drying liquid need not contain the fluorine-containing compound throughout the drying process; instead, the fluorine-containing compound may be introduced after the process has commenced and/or ceased before the drying process is completed.

Heating of the wafer W by heating assembly 50 is preferably effected so that the wafer W attains a temperature in the range of 30-300° C., and more preferably 40-300° C. That temperature can vary over the course of heating, for example, it is preferable that the temperature be in a range of 30-82° C., and more preferably 40-82° C., before the IPA is largely driven off. Heating to higher temperatures in the range of 83-300° C. promotes desorption of IPA as well as desorption of HF, and thereby prevents the HF from significantly etching the silicon of the wafer and device structures.

While the present invention has been described in connection with various preferred embodiments thereof, it is to be understood that those embodiments are provided merely to illustrate the invention, and that the invention is not limited to those embodiments, but rather includes that which is encompassed by the true scope and spirit of the appended claims.

What is claimed is:

1. A method for drying wafer-shaped articles, comprising:
   rotating a wafer-shaped article of a predetermined diameter on a rotary chuck;
   dispensing a drying liquid onto one side of said wafer-shaped article, said drying liquid comprising greater than 50 mass % of an organic solvent; and
   during at least part of said dispensing step, heating said wafer-shaped article with a heating assembly,
   wherein, during at least part of said dispensing step a fluorine-containing compound is present in a gas that surrounds said drying liquid as said drying liquid contacts said wafer-shaped article.

2. The method according to claim 1, wherein said organic solvent is an alcohol.

3. The method according to claim 1, wherein said organic solvent is isopropyl alcohol.

4. The method according to claim 1, wherein, during at least part of said dispensing step, the fluorine-containing compound is contained in the drying liquid.

5. The method according to claim 4, wherein said fluorine-containing compound is hydrofluoric acid.

6. The method according to claim 4, wherein said fluorine-containing compound is present in said drying liquid at a concentration of at least 0.0001 mass % and less than 10 mass %.

7. The method according to claim 4, wherein said fluorine-containing compound is present in said drying liquid at a concentration of at least 0.05 mass % and less than 10 mass %.

8. The method according to claim 1, wherein said fluorine-containing gas is hydrogen fluoride.

9. The method according to claim 1, wherein said fluorine-containing gas has an oxygen concentration of less than 1 mass %.

10. The method according to claim 1, wherein said wafer-shaped article comprises semiconductor device structures formed on said one side of said wafer-shaped article.

11. The method according to claim 1, wherein said heating step comprises heating said wafer-shaped article to a temperature in a range of 30-300° C.

12. The method according to claim 1, wherein said heating step comprises heating said wafer-shaped article to a temperature in a range of 40-300° C.

13. The method according to claim 1, wherein said drying liquid comprises less than 30 mass % water.

14. The method according to claim 1, wherein said drying liquid comprises less than 15 mass % water.

15. The method according to claim 1, wherein said heating assembly comprises an array of radiant heating elements, said array covering said wafer-shaped article.

16. The method according to claim 15, wherein said array of radiant heating elements is distributed among at least five individually controllable groups each occupying a respectively different zone extending from a more central region of said rotary chuck to a more peripheral region of said rotary chuck.

17. The method according to claim 16, wherein said dispensing step is performed using a liquid dispenser comprising one or more dispensing orifices configured to move a discharge point from a more central region of said wafer-shaped article to a more peripheral region of said wafer-shaped article, and wherein a power supplied to each of said at least five individually controllable groups of radiant heating elements is based on a position of said discharge point of said liquid dispenser.

18. The method according to claim 4, wherein, prior to or during said dispensing step, said drying liquid is mixed with the fluorine-containing compound in a manifold.

19. The method according to claim 1, wherein the heating assembly is substantially coextensive with said wafer-shaped article.

* * * * *